US008481341B2

(12) United States Patent
Clark

(10) Patent No.: US 8,481,341 B2
(45) Date of Patent: Jul. 9, 2013

(54) EPITAXIAL FILM GROWTH IN RETROGRADE WELLS FOR SEMICONDUCTOR DEVICES

(75) Inventor: Robert D. Clark, San Marcos, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/487,878

(22) Filed: Jun. 4, 2012

(65) Prior Publication Data

US 2013/0115721 A1 May 9, 2013

Related U.S. Application Data

(60) Provisional application No. 61/556,215, filed on Nov. 5, 2011.

(51) Int. Cl.
*H01L 21/8238* (2006.01)
*H01L 21/66* (2006.01)
*H01L 21/20* (2006.01)
*H01L 21/36* (2006.01)

(52) U.S. Cl.
USPC 438/12; 438/481; 257/E21.633; 257/E21.525; 257/E21.09

(58) Field of Classification Search
None
See application file for complete search history.

(56) References Cited

U.S. PATENT DOCUMENTS 7,696,000 B2 4/2010 Liu et al.
8,034,697 B2 * 10/2011 Fiorenza et al. ............ 438/481

OTHER PUBLICATIONS

Li, J.Z. et al., Thin Film InP Epitaxy on Si (001) Using Selective Aspect Ratio Trapping, The Electrochemical Society, ECS Transactions, 18(1), 2009, pp. 887-894.
Hydrick, J.M. et al., Chemical Mechanical Polishing of Epitaxial Germanium on SiO2-patterned Si(001) Substrates, The Electrochemical Society, ECS Transactions, 16(10), 2008, pp. 237-248).
Destefanis, V., et al., Selective Epitaxial Growth of Ge(1 1 0) in Trenches using the Aspect Ratio Trapping Technique, Journal of Crystal Growth, vol. 310, 2010, pp. 918-925.
Li, J.Z. et al., Monolithic Integration of GaAs/InGaAs Lasers on Virtual Ge Substrates via Aspect-Ratio Trapping, the Electrochemical Society, 156(7), 2009, pp. H574-H578.
Florenza, James et al., Trenches Turbocharge Silicon, Compound Semiconductor, Technology Integration, 2009, pp. 21-23.
Li, J.Z. et al., Form GaAs/InGaAs Lasers on Virtual Ge, Microwaves & RF, Oct. 22, 2009, 6 pp.
Li, J.Z. et al., Defect Reduction of GaAs/Si Epitaxy by Aspect Ratio Trapping, Journal of Applied Physics, vol. 103, 2008, pp. 106102-1-106102-3.

* cited by examiner

*Primary Examiner* — Seahvosh Nikmanesh
(74) *Attorney, Agent, or Firm* — Wood, Herron & Evans, LLP

(57) ABSTRACT

A method of fabricating a semiconductor device. A substrate is provided and includes a dielectric layer and a mask layer, which is patterned and developed. A plurality of trenches is created within the dielectric material by a retrograde etching process. The plurality of trenches is subsequently overfilled with a material by heteroepitaxial growth with aspect ratio trapping. The material includes at least one of germanium, a Group III-V compound, or a combination of two or more thereof. The overfilled plurality of trenches is then planarized.

20 Claims, 8 Drawing Sheets

EPITAXIAL FILM GROWTH IN RETROGRADE WELLS FOR SEMICONDUCTOR DEVICES

CROSS-REFERENCE TO RELATED APPLICATIONS

Pursuant to 37 C.F.R. §1.78(a)(4), this application claims the benefit of and priority to prior filed co-pending Provisional Application Ser. No. 61/556,215, filed Nov. 5, 2011, which is expressly incorporated herein by reference.

FIELD OF THE INVENTION

This invention relates to methods of fabricating semiconductor devices and, more particularly, methods of fabrication that reduce a dislocation density in features of semiconductor devices.

BACKGROUND OF THE INVENTION

Complementary metal-oxide-semiconductor ("CMOS") is a technology often used in fabricating integrated circuits used in microprocessors, microcontrollers, and other digital logic circuits. CMOS devices often include complementary and symmetrical pairs of field effect transistors ("FET"), namely n-type and p-type metal-oxide semiconductor field effect transistors ("MOSFET"), to form the logical gates and digital circuits.

In use, two n-type semiconductor regions (otherwise referenced as a source and a drain) are electrically-coupled by a gate. In some devices, a narrow channel, called a FIN structure, is located between the source and the drain and with a dielectric material separating the FIN structure from the gate.

Instrumental to the function of CMOS devices is electron mobility, or how quickly electrons move through a material when drawn by an electric field. For example, increased electron mobility along a FIN structure could drastically decrease energy consumption of the device without decreasing its speed. Devices using Group III-V compounds (such as InAs and InSb) and/or germanium in FIN structures and other components of the device have shown great promise in providing the desired increase in electron mobility.

However, integration of Group III-V compounds and/or germanium into conventional CMOS devices cannot be accomplished using conventional fabrication methods. A lattice-mismatch is created during conventional deposition of Group III-V compounds and/or germanium onto silicon and/or dielectric materials (such as silicon dioxide). The lattice-mismatches create dislocations, which are crystallographic defects formed during growth of a crystal structure and ultimately affect the properties of the crystal, including electron mobility. In other words, heteroepitaxial growth of a crystal adjacent a dielectric material creates a tension on the surface of the crystal in at least one lattice plane. The presence of one dislocation in one plane may be propagated to adjacent lattice planes, perpetuating the dislocation and further decreasing electron mobility. One known, conventional approach to reducing the further distortion of adjacent lattice planes is Aspect Ratio Trapping ("ART"). The ART deposition procedure is a repeated, two-step deposition-crystallization procedure configured to trap dislocations at the laterally-extending confining sidewalls of a feature. So-called buffer layers may be used to reduce the lattice mismatch between growth cycles.

However, the number of dislocations remains an issue in CMOS fabrication. There is thus a need for methods of heteroepitaxial growth of Group III-V compounds and/or germanium on dielectric materials while increasing the structural fortitude of resultant structures, such as the FIN structure.

SUMMARY OF THE INVENTION

The present invention overcomes the foregoing problems and other shortcomings and drawbacks of the known, conventional methods of incorporating Group III-V compounds and/or germanium on silicon-based substrates. While the present invention will be described in connection with certain embodiments, it will be understood that the present invention is not limited to these embodiments. To the contrary, this invention includes all alternatives, modifications, and equivalents as may be included within the scope of the present invention.

In accordance with one embodiment of the present invention, a method of fabricating a semiconductor device includes providing a substrate having a dielectric layer and a mask layer thereon. The mask layer is patterned and developed such that a plurality of trenches may be created by a retrograde etching process. The plurality of trenches is subsequently overfilled with a material by heteroepitaxial growth of the material using Aspect Ratio Trapping. The material includes at least one of germanium, a Group III-V compound, or a combination of two or more thereof. The overfilled plurality of trenches is then planarized.

Another embodiment of the present invention is directed to a method of fabricating a semiconductor device, which includes providing a substrate having a plurality of FIN structures and a dielectric layer surrounding each of the plurality of FIN structures. Each of the FIN structures of the plurality has a base, an opening, and at least one sidewall extending between the base and the opening, wherein a lateral dimension of the base is greater than a lateral dimension of the opening. A first portion of the plurality of FIN structures is masked while a second portion of the plurality of FIN structures remains unmasked. The second portion of the plurality of FIN structures is etched and then, by heteroepitaxial growth using Aspect Ratio Trapping, the FIN structures of the second portion of the plurality of FIN structures are overfilled with a material, which includes at least one of germanium, a Group III-V compound, or a combination of two or more thereof. The overfilled, second portion of the plurality of FIN structures is then planarized.

BRIEF DESCRIPTION OF THE DRAWINGS

The accompanying drawings, which are incorporated in and constitute a part of this specification, illustrate embodiments of the present invention and, together with a general description of the invention given above, and the detailed description given below, serve to explain the invention.

DETAILED DESCRIPTION

Figure 1:
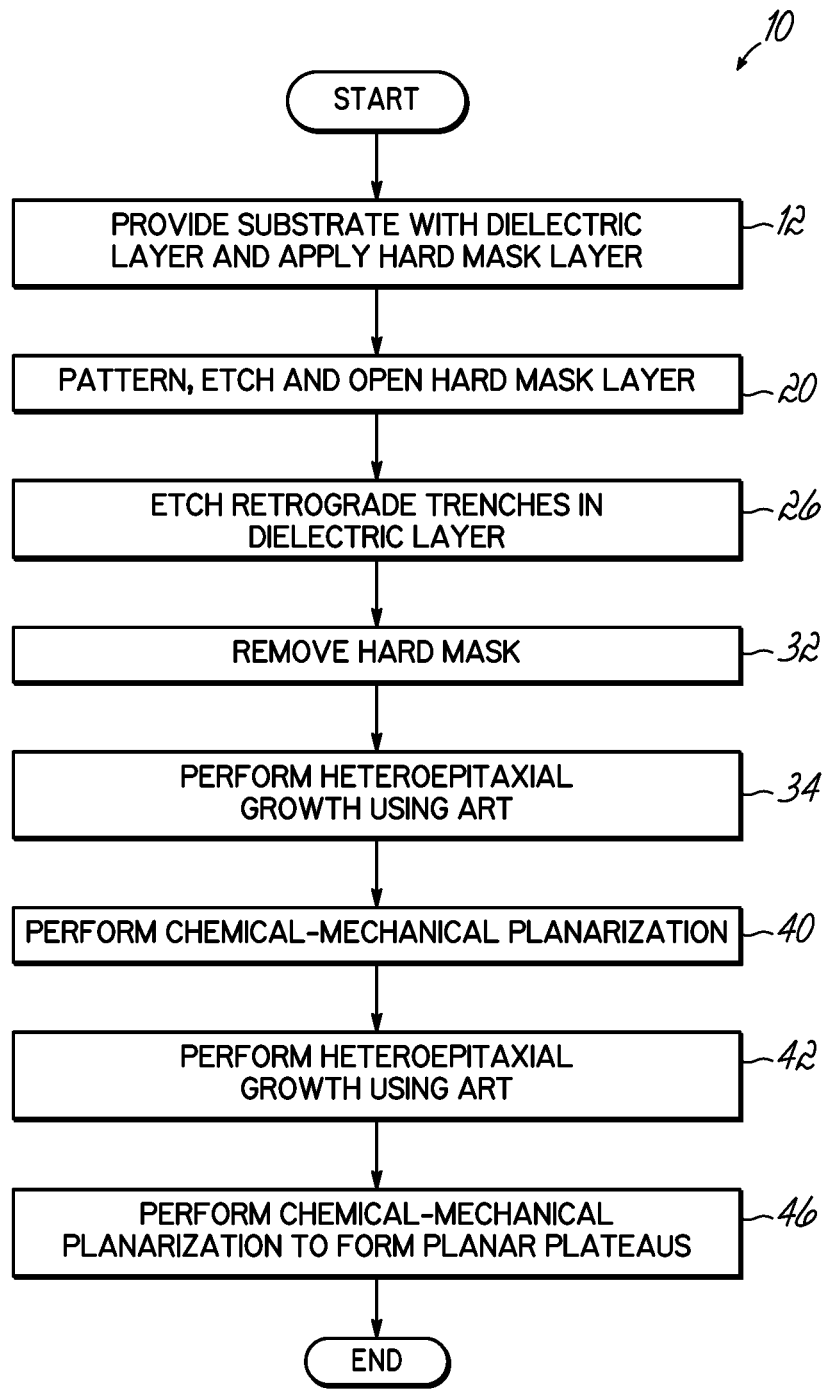
FIG. 1 is a flow chart illustrating a method of fabricating a semiconductor device in accordance with one embodiment of the present invention.

With reference now to the figures, and in particular to FIG. 1, a flow chart 10 illustrating one method of heteroepitaxial growth of a material, using Aspect Ratio Trapping ("ART"), on a dielectric layer for fabricating a semiconductor 11 (FIG. 2A) is shown. FIGS. 2A-2G diagrammatically illustrate the method provided in FIG. 1.

Figure 2A:
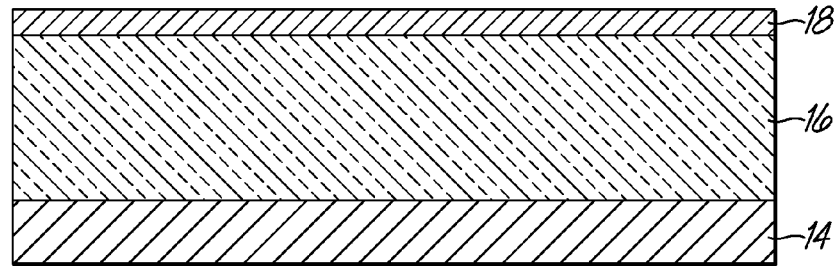
FIGS. 2A-2G are diagrammatic views of a device fabricated in accordance with the method of FIG. 1.

In Step 12, and with reference to FIG. 2A, a substrate 14 having a dielectric layer 16 thereon is provided such that a hard mask 18 is deposited onto the dielectric layer 16. The substrate 14 may be silicon-based material, as is conventional, with, for example, silicon dioxide ($SiO_2$) forming the dielectric layer 16. The hard mask 18 may be single or multi-layered, wherein at least one layer contains silicon, at least one layer contains silicon and oxygen, or at least one layer contains a metal. For example, a metal-containing hard mask layer 18 may include titanium (Ti), titanium nitride ($TiN_y$), tantalum (Ta), tantalum nitride ($TaN_y$), aluminum (Al), or aluminum-copper alloy (Al—Cu); a dielectric material, such as silicon carbide ($SiC_y$), silicon oxide ($SiO_y$), silicon nitride ($SiN_y$), or silicon oxynitride ($SiO_yN_z$); or an amorphous carbon (a-C). The at least one hard mask layer 18 may be formed using a vapor deposition process, such as chemical vapor deposition ("CVD"), or plasma enhanced CVD ("PECVD").

Although not necessarily shown, the hard mask layer 18 may further include a photoresist layer operable to be patterned, for example, with a wavelength of light and processed. The photoresist pattern may be transferred to the hard mask layer 18 via an etching process, such as a dry, plasma etching process or a dry, non-plasma etching process. When utilizing a dry plasma etching process, the plasma etch gas composition may include a halogen-containing chemistry. For example, the plasma etch gas composition may include $Cl_2$, $BCl_3$, $Br_2$, HBr, $SF_6$, or $NF_3$, or any combination of two or more thereof. Additionally, for example, the plasma etch gas composition may include a fluorocarbon-based chemistry such as at least one of $C_4F_8$, $C_5F_8$, $C_3F_6$, $C_4F_6$, $CF_4$, etc., or a fluorohydrocarbon-based chemistry such as at least one of $CHF_3$, $CH_2F_2$, etc., or a combination of two or more thereof. Furthermore, additive gases may include an inert gas, such as a noble gas, oxygen, hydrogen, nitrogen, $CO_2$, or CO, or two or more thereof. Alternatively, as would be understood by one skilled in the art of dry plasma etching, any etching process chemistry may be employed that selectively etches the at least one hard mask layer 18 relative to the photoresist layer.

Figure 2B:
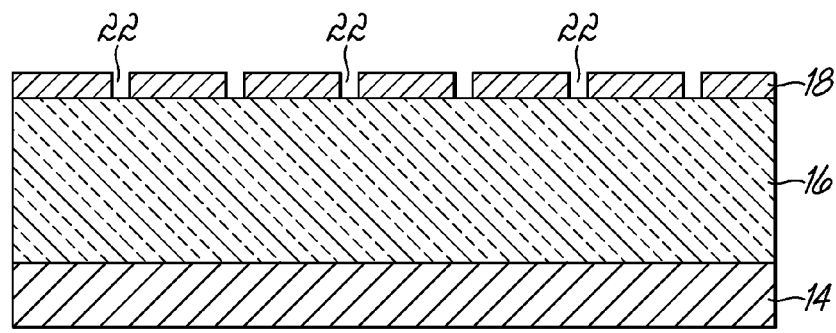

In any event, in Step 20, the hard mask layer 18 is patterned, etched, and opened, as shown in FIG. 2B, so as to provide openings 22 therein for fabricating one or more trenches 24 (FIG. 2C) within the dielectric layer 16.

Figure 2C:
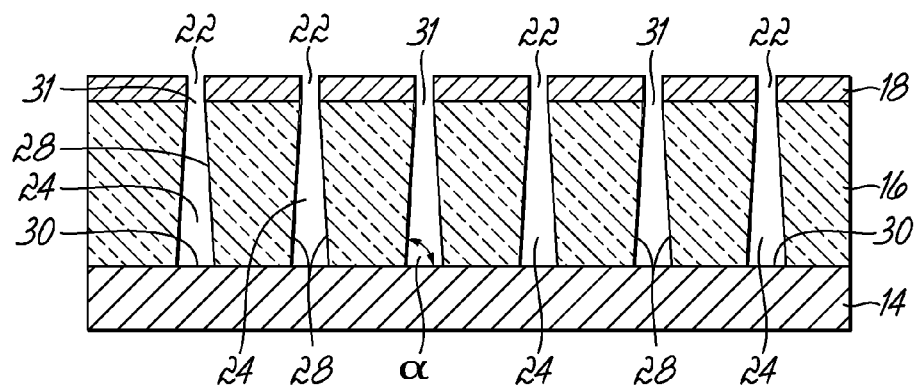

As shown in FIG. 2C, in Step 26 the one or more trenches 24 may be formed via retrograde etching of the dielectric layer 16 to the silicon-based substrate 14. Retrograde etching, which is a deep reactive-ion etching ("DRIE") based process, results in trenches 24 having sidewalls 28 forming an angle, α, with a surface 30 of the silicon substrate 14, wherein α may range from about 45° to about 90°. Said another way, the trenches 24 may taper from the surface 30 of the silicon substrate 14 toward an opening 31 formed at the hard mask layer 18. Described in still another way, the bottom of each trench 24 (which, herein, is the surface 30 of the substrate 14 exposed within the trench 24) will have a lateral dimension (for example, length, width, or diameter) that is larger than a lateral dimension of the opening 31. According to one example, the ratio of the lateral dimensions (opening-to-bottom) may range from 2 to 5.

A representative DRIE process for forming the trenches 24 may include a Bosch etch process characterized by a very high etching rate for silicon, a high aspect ratio, and a high selectivity to oxide. The Bosch etch process includes an anisotropic etching process that alternates repeatedly between cycles of etching and passivation. During the etching step, a plasma generated from a source gas, such as $SF_6$, is used to etch the material of the dielectric layer 16. During the passivation step, a plasma generated from a source gas, such as $C_4F_8$, coats the sidewalls 28 of the trenches 24 with a chemically-inert passivation layer. The passivation layer is operable to control laterally-directed etching of the sidewalls 28 during the subsequent etching step.

Alternatively, another DRIE process for forming the trenches 24 concurrently uses a $SF_6$ plasma to etch and a halide chemistry ($HBr/Cl_2/O_2$, $HBr/O_2$, or $Cl_2/O_2$) based plasma to passivate the sidewalls 28.

Once trench formation is complete, the hard mask 18 is removed in Step 32 and the trenches 24 are filled by heteroepitaxial growth of a material using ART in Step 34. The material may include a compound having a high electron mobility and, according to embodiments of the present invention described herein, includes at least one of germanium (Ge), a Group III-V compound, or a combination of two or more thereof. Group III-V compounds include elements from Groups III and V of the periodic table, for example, gallium arsenide (GaAs), indium phosphide (InP), indium phosphide arsenide (InPAs), and so forth as would be known to one of ordinary skill in the art.

Figure 2D:
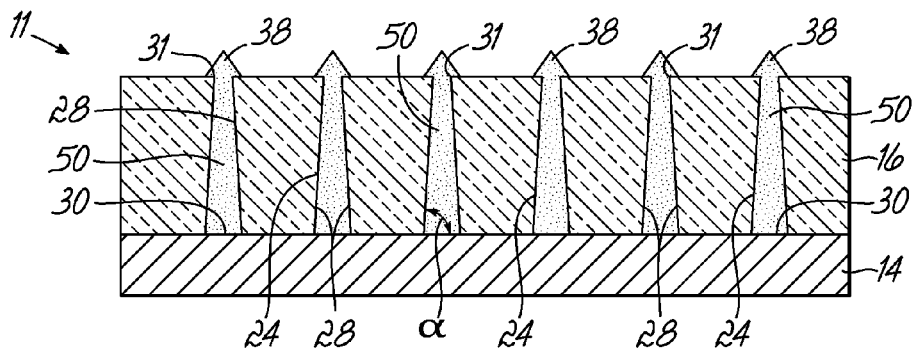
Figure 3:
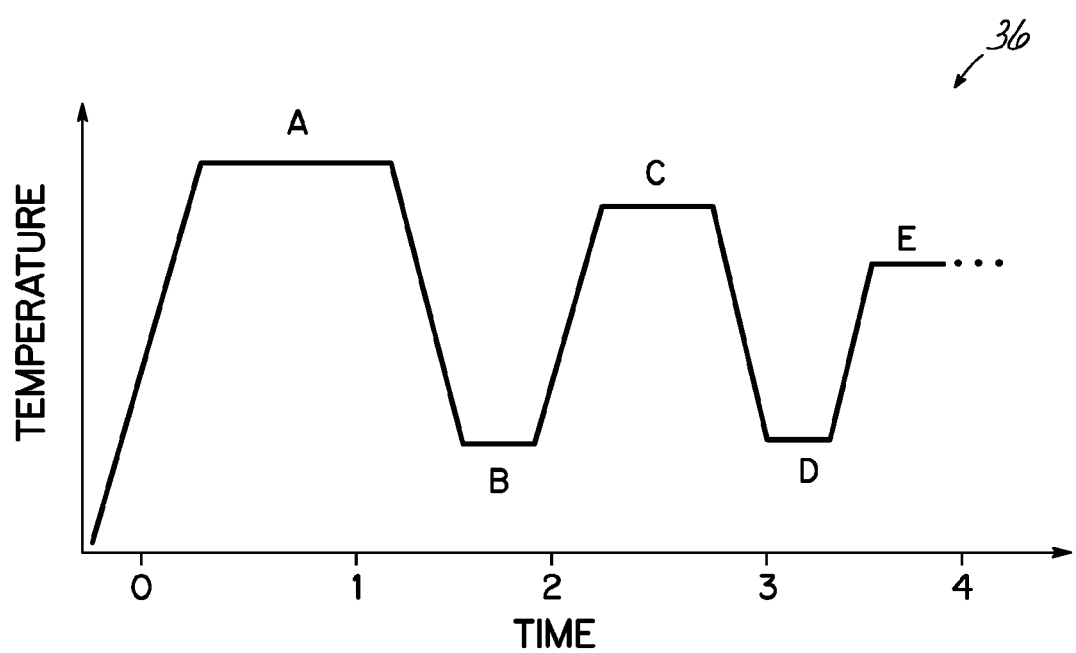
FIG. 3 is a timeline illustrating the step-wise method of performing Aspect Ratio Trapping.

According to one exemplary ART process, and as shown in the timeline 36 of FIG. 3 and with reference to FIG. 2C, the substrate 14 may be preheated (Step A) in a reducing environment to remove oxide films on the sidewalls 28 of the trench 24. The temperature of the substrate 14 is lowered (Step B) such that a first buffer layer (for example, GaAs) may be deposited within the trenches 24. Buffer layers are operable to overcome lattice mismatch between the dielectric layer 16 and the subsequently grown crystal 50, shown in FIG. 2D. The substrate temperature is raised (Step C) for crystal growth from the deposited buffer layer. Again, the temperature of the substrate 14 is lowered (Step D) such that a second buffer layer (which may be the same, the example here being GaAs, or different, for instance, InP) is deposited within the trenches 24, and the temperature is raised (Step E) to facilitate further crystal growth. The two-step process of low heat buffer deposition and a high heat crystal growth is repeated a number of times until a first overgrowth 38 is formed above each trench 24, as shown in FIG. 2D.

Figure 2E:
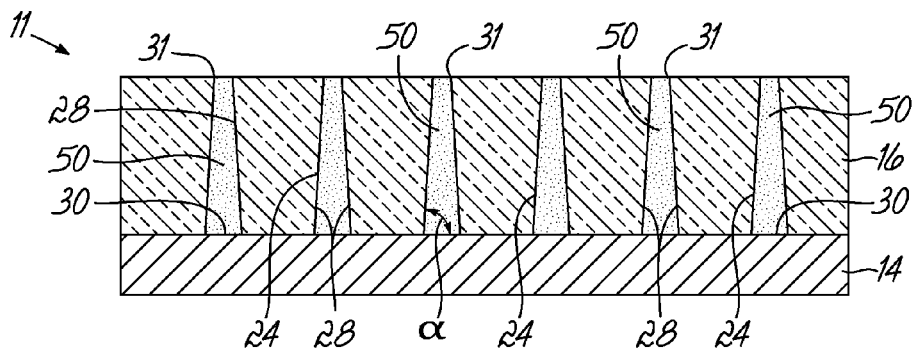

Referring now to FIGS. 1, 2D, and 2E, a chemical mechanical polishing ("CMP") method may be performed (Step 40) to remove the first overgrowth 38. According to one embodiment of the present invention, a polishing slurry comprising KOH, colloidal silica, and one or more of NaOCl, $NH_4OH$, or $H_2O_2$ is used with a polishing pad to remove excess material forming the first overgrowth 38 without introducing surface contamination. It would be understood by those skilled in the art that other CMP methods may be used and the present invention is not limited to the particular example provided herein.

Figure 2F:
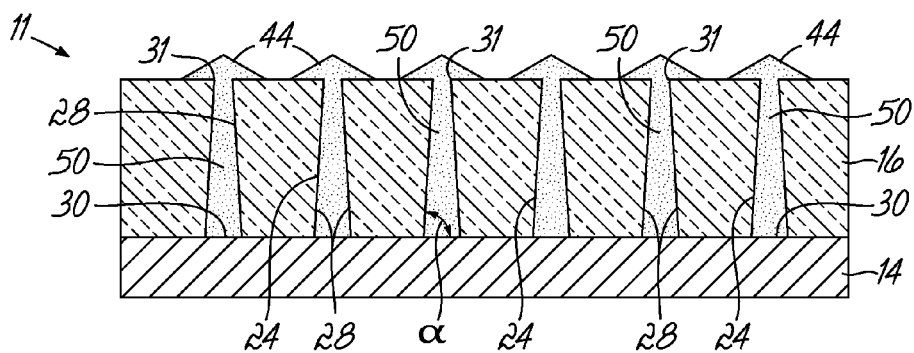
Figure 2G:
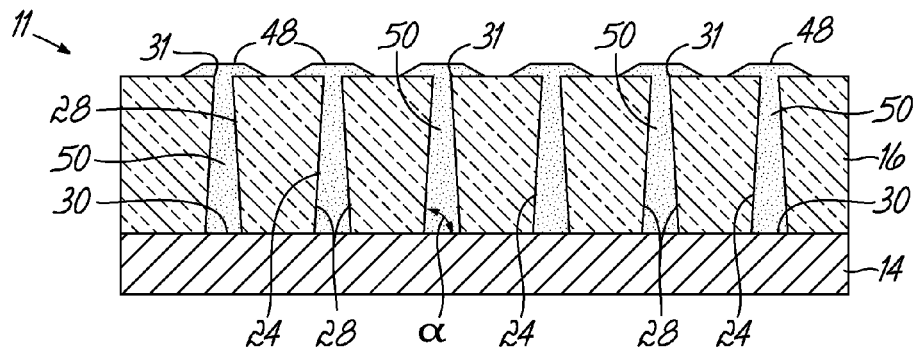

Referring now to FIGS. 1, 2F, and 2G and in accordance with Step 42, heteroepitaxial growth using ART may be repeated to form a second overgrowth 44 above each trench 24. The second overgrowths 44 are again removed in Step 46 via a second CMP process, for instance, to form planar plateaus 48 suitable for use in further fabrication of CMOS devices.

The process as shown in FIG. 1 according to one embodiment of the present invention reduces the number of dislocations formed during fabrication of the CMOS device as compared to conventional methods. In that regard, the process may be optimized so as to minimize the number of allowed dislocations within an area (a density of dislocation). In that regard, although not specifically illustrated, a pre-determined dislocation density is selected, which may be based, in part, on a desired electron mobility or tolerable level of contamination, for example. In one exemplary method, the pre-determined dislocation density may range from about $e^{10}$ dislocations per cubic centimeter to about $e^{22}$ dislocations per cubic centimeter.

In use, and after Step 46, the semiconductor 11 of FIG. 2G may be removed and a dislocation density measured for the material 50 within each trench 24, such as by transmission electron micrograph or microscopy, field ion microscopy, and so forth. If the measured dislocation density is within the selected range of the pre-determined dislocation density, then the semiconductor 11 may be further processed. Alternatively, if the measured dislocation density exceeds the pre-determined dislocation density, then one or more steps of the above-described process may be altered, including, changing an aspect ratio or retrograde angle of the trenches 24, changing the material 50, or adding one or more buffer layers during the ART. The altered process may be performed on a new semiconductor, which is subsequently evaluated in a similar manner.

Figure 4:
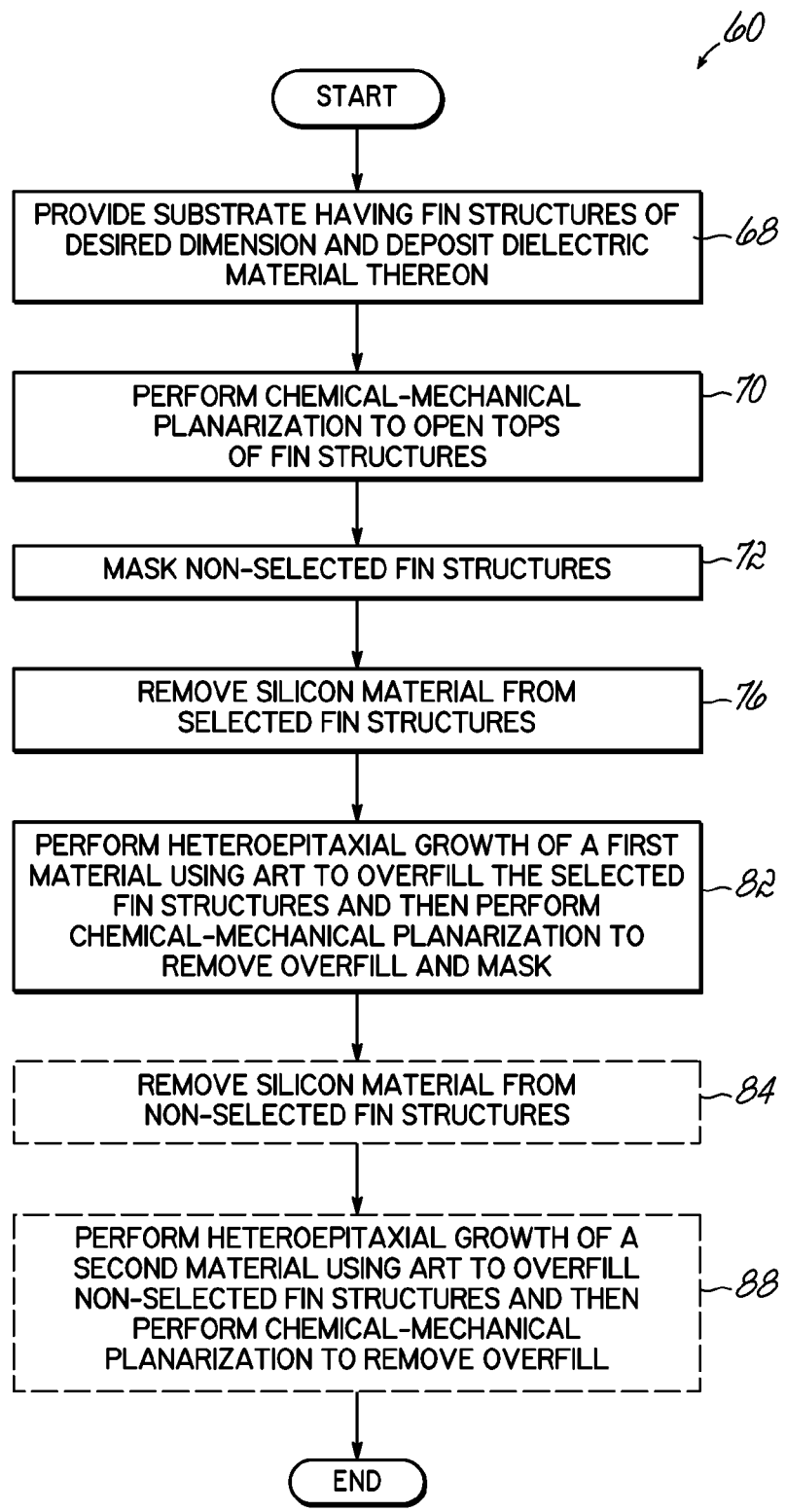
FIG. 4 is a flow chart illustrating a method of integrating epitaxial FIN structures into a CMOS device in accordance with one embodiment of the present invention.
Figure 5A:
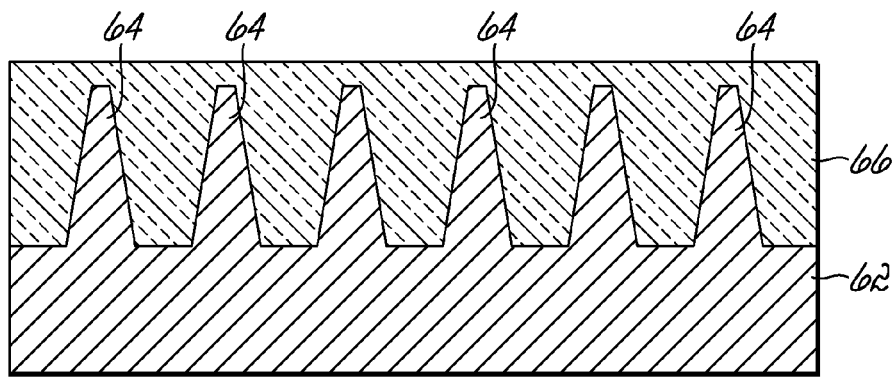
FIGS. 5A-5F are diagrammatic views of the method of FIG. 4 of integrating epitaxial FIN structures into the CMOS device.
Figure 5B:
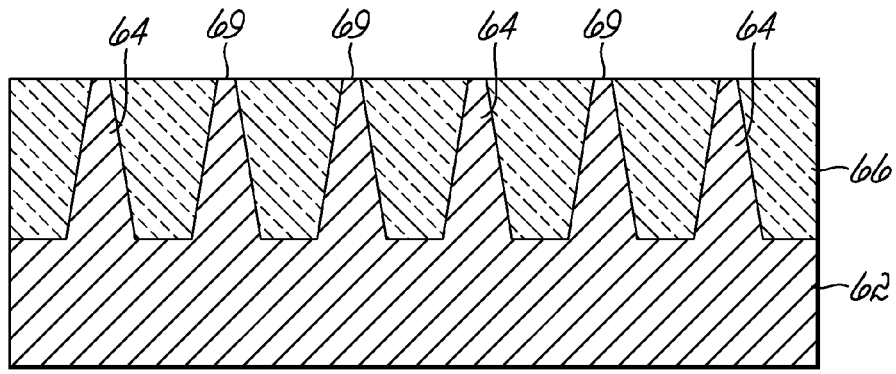

In reference now to FIG. 4, a flow chart 60 directed to a method of FIN replacement for CMOS integration is described in accordance with one embodiment of the present invention. In that regard, and with additional reference to FIG. 5A, a substrate 62 having FIN structures 64 of a desired dimension is provided and a dielectric layer 66 is deposited thereon in Step 68. In Step 70, and as shown in FIG. 5B, the dielectric layer 66 is processed via a chemical-mechanical planarization, such as the process described in detail above with respect to FIG. 2E, so as to form open tops 69 on the FIN structures 64.

Figure 5C:
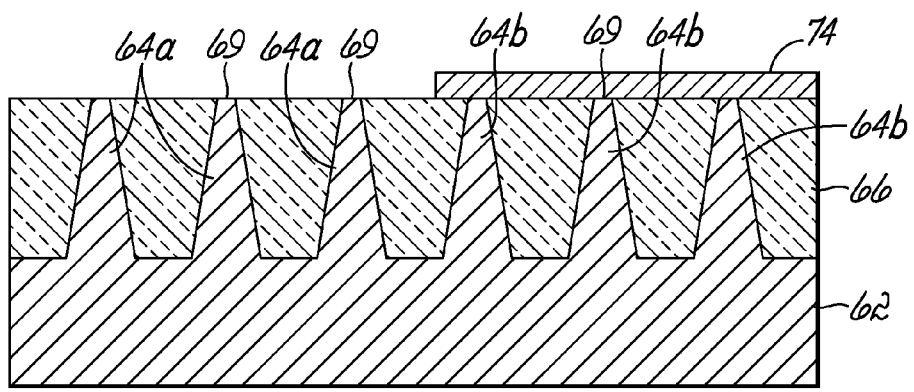
Figure 5D:
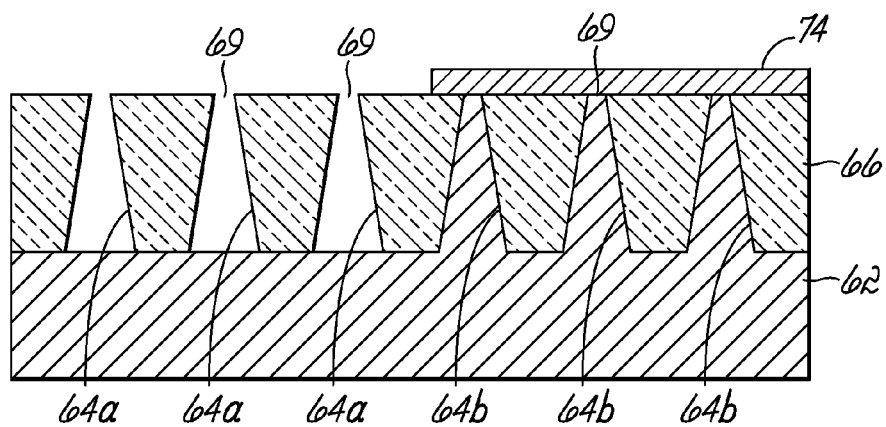
Figure 5E:
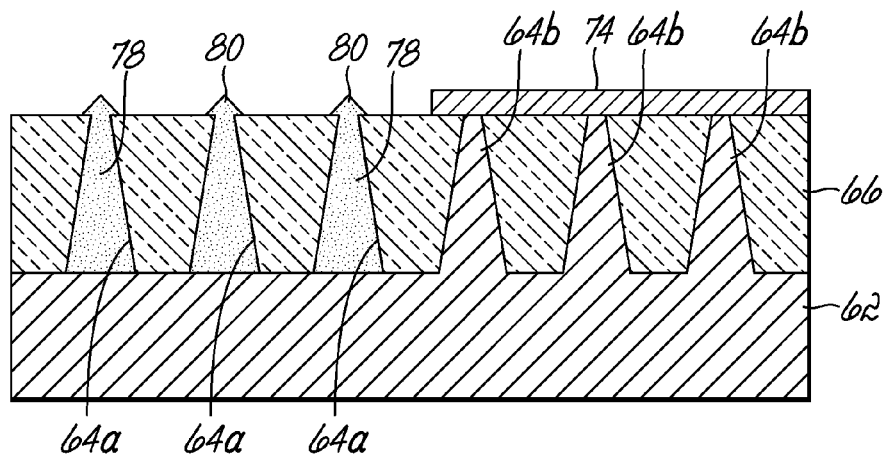
Figure 5F:
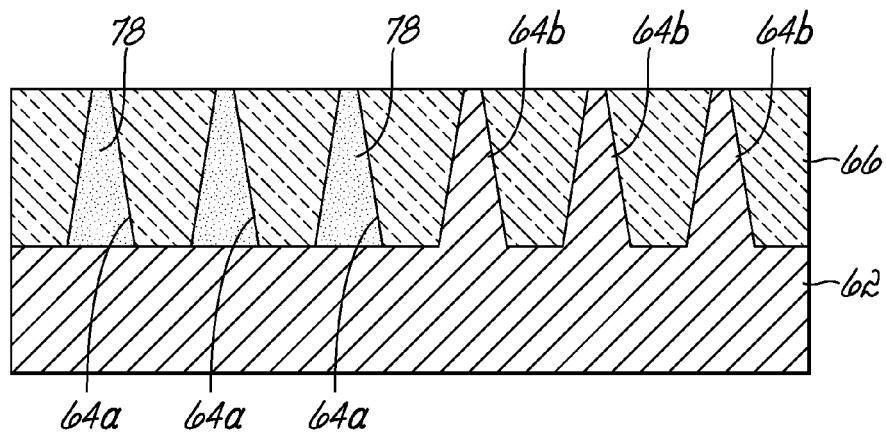

In Step 72, a mask 74 may be applied to those FIN structures not selected for replacement, hereafter referenced as non-selected FIN structures 64b, while selected FIN structures 64a remain unmasked, as shown in FIG. 5C. Accordingly, the selected FIN structures 64a may be further processed without processing the non-selected FIN structures 64b. Specifically, silicon within the selected FIN structures 64a is removed in FIG. 4, as shown in FIG. 5D, via, for example, an etch process (Step 76) for selectively etching the silicon from the selected FIN structures 64a. In Step 82, heteroepitaxial growth of a first material 78 using ART may then proceed in a manner described above with reference to Step 34 of FIG. 1. The material may include at least one of Ge, a Group III-V compound, or a combination of two or more thereof. The ART process in Step 82 continues until an overgrowth 80 is formed above each of the selected FIN structures 64a, as shown in FIG. 5E. The overgrowth 80 is subsequently removed in Step 82 with chemical-mechanical planarization, as shown in FIG. 5F. The chemical-mechanical planarization of Step 82 may also remove the mask 74 from the non-selected FIN structures 64b.

Although not shown, it would be understood that a second overgrowth may be formed on and subsequently removed from the selected FIN structures 64a, as was described in detail with respect to Steps 42 and 46 of FIG. 1.

Figure 6A:
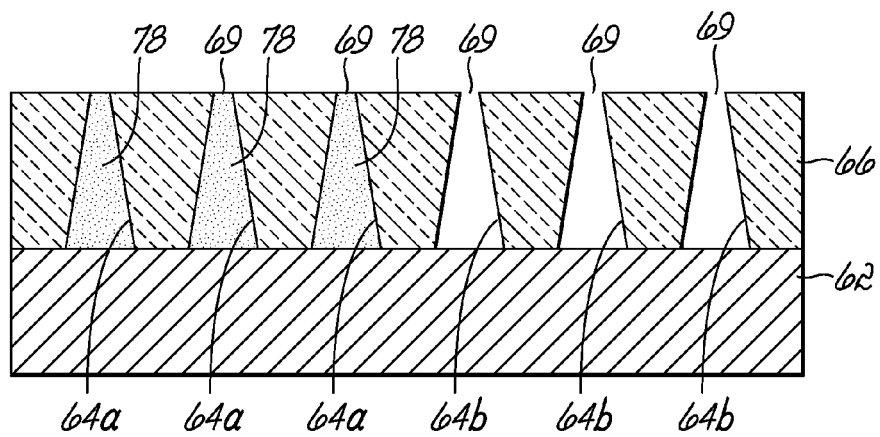
FIGS. 6A-6C are diagrammatic views of the optional, additional steps in the method of FIG. 4 of integrating epitaxial FIN structures into the CMOS device.
Figure 6B:
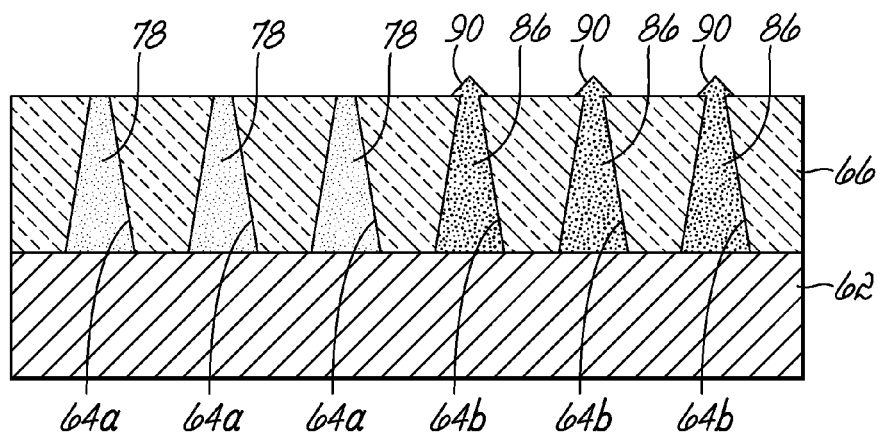
Figure 6C:
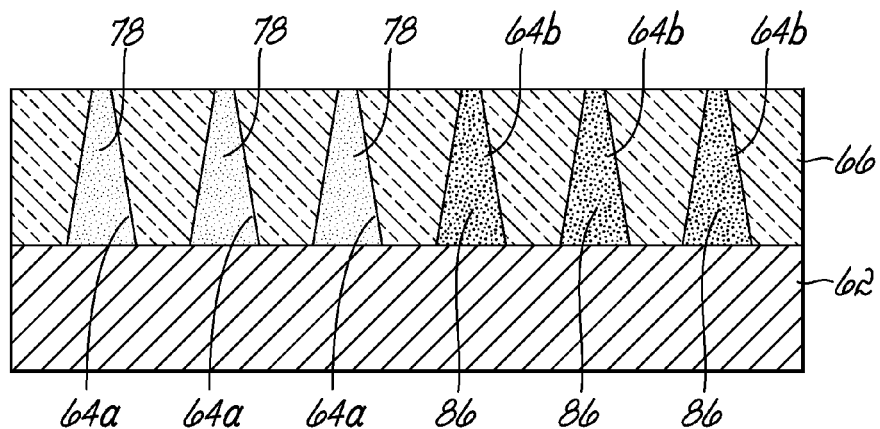

If desired, the substrate 62 of FIG. 5F may be used in further CMOS fabrication or, as described in detail below, the substrate 62 may undergo further processing as described herein. More particularly, and with reference to FIG. 4 and FIG. 6A, silicon of the non-selected FIN structures 64b may be removed in Step 84 and subsequently replaced with a second material 86, as shown in FIG. 6B, by heteroepitaxial growth using the ART process in Step 88. Although not necessary, the second material 86 will generally differ from the first high electron mobility material 78 but also includes at least one of Ge, a Group III-V compound, or a combination of two or more thereof. Crystal growth continues until an overgrowth 90 is formed above each of the non-selected FIN structures 64b, as shown in FIG. 6B, and the overgrowth 90 is subsequently removed by chemical-mechanical planarization, as shown in FIG. 6C.

Again, and if desired, a second overgrowth may be formed on and subsequently removed from the non-selected FIN structures 64b. Additionally, it would be appreciated by those of ordinary skill in the art that masking of the FIN structures need not limit the FIN structures to two groups, or portions of the plurality. Instead, a first mask may be used to replace the material of a first subset of the FIN structures. After the first mask is removed, a second mask may then be used so as to replace the material of a second subset of FIN structures. Thus, the number of masks used in the process will be related to the number of FIN structure subsets desired in the particular CMOS device. Furthermore, and while not shown herein, an opposing side of the substrate may be processed as described above or in accordance with other steps consistent with fabricating integrated circuits.

If desired, the replaced FIN structures may be evaluated in accordance with the method described above by measuring and comparing a number of dislocations to a pre-determined number.

As provided in detail herein, a method of forming a semiconductor device includes retrograde etching of trenches within a dielectric layer, heteroepitaxial growth of a material using ART, and planarization of the resulting overgrowth. Retrograde etching of the trenches further reduces the dislocation density of the material within the trenches and increases a structural fortitude of the same for subsequent processing.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope of the general inventive concept.

What is claimed is:

1. A method of fabricating a semiconductor device comprising:
    (a) providing a substrate containing a dielectric layer on the substrate and a mask layer on the dielectric layer;
    (b) patterning and developing the mask layer;
    (c) retrograde etching a plurality of trenches in the dielectric layer;
    (d) overfilling, by heteroepitaxial growth with aspect ratio trapping, the plurality of trenches with a material, the material including at least one of germanium, a Group III-V compound, or a combination of two or more thereof; and
    (e) planarizing the overfilled plurality of trenches.

2. The method of claim 1, further comprising:
removing the patterned mask layer before (c), retrograde etching the plurality of trenches.

3. The method of claim 1, wherein the Group III-V compound includes GaAs, InP, or InGaAs.

4. The method of claim 1, wherein aspect ratio trapping includes depositing one or more buffer layers configured to overcome a lattice mismatch between the material and the dielectric layer.

5. The method of claim 1, wherein each of the plurality of trenches includes at least one sidewall, a base, and an opening opposing the base, the at least one sidewall forming a retrograde angle with respect to the base, the retrograde angle ranging from about 45° to about 90°.

6. The method of claim 1, wherein each of the plurality of trenches includes at least one sidewall, a base, and an opening opposing the base, a ratio of a lateral dimension of the opening to a lateral dimension of the base ranging from about 2 to about 5.

7. The method of claim 1, further comprising:
(f) measuring a dislocation density of the material within each of the plurality of trenches;
(g) comparing the measured dislocation density to a pre-determined dislocation density; and
(h) either (1) further processing the substrate when the measured dislocation density is less than the pre-determined dislocation density or (2) replacing the substrate with a new substrate and repeating (a)-(e) on the new substrate while changing an aspect ratio of the plurality of trenches, a retrograde angle of the plurality of trenches, changing the material, or adding one or more buffer layers during the aspect ratio trapping.

8. The method of claim 7, wherein the pre-determined dislocation density ranges from about $e^{10}$ dislocations per cubic centimeter to about $e^{22}$ dislocations per cubic centimeter.

9. The method of claim 1, wherein retrograde etching of the plurality of trenches is operable to increase a structural fortitude of each trench of the plurality.

10. The method of claim 1, wherein the semiconductor device includes at least one p-type field effect transistor and at least one n-type field effect transistor, the plurality of trenches forming FIN structures of the at least one n-type field effect transistor.

11. The method of claim 1, further comprising:
(f) again overfilling, by heteroepitaxial growth with aspect ratio trapping, the plurality of trenches with the material; and
(g) planarizing the overfilled plurality of trenches to form a planarized plateau at each of the plurality of trenches.

12. A method of forming a semiconductor device comprising:
(a) providing a substrate having a plurality of FIN structures and a dielectric layer surrounding each of the plurality of FIN structures, each of the FIN structures having a base, an opening, and a sidewall extending between the base and the opening, a lateral dimension of the base being greater than a lateral dimension of the opening;
(b) masking a first portion of the plurality of FIN structures while a second portion of the plurality of FIN structures remains unmasked;
(c) etching the second portion of the plurality of FIN structures;
(d) overfilling, by heteroepitaxial growth with aspect ratio trapping, the second portion of the plurality of FIN structures with a first material, the first material including at least one of germanium, a Group III-V compound, or a combination of two or more thereof; and
(e) planarizing the overfilled second portion of the plurality of FIN structures.

13. The method of claim 12, further comprising:
(f) etching the first portion of the plurality of FIN structures;
(g) overfilling, by heteroepitaxial growth with aspect ratio trapping, the first portion of the plurality of FIN structures with a second material, the second material including a different one of the at least one of germanium, a Group III-V compound, or a combination of two or more thereof; and
(h) planarizing the overfilled first portion of the plurality of FIN structures.

14. The method of claim 13, wherein the first portion of the plurality of FIN structures is incorporated into at least one p-type field effect transistor and the second portion of the plurality of FIN structures is incorporated into at least one n-type field effect transistor.

15. The method of claim 12, wherein the Group III-V compound includes GaAs, InP, or InGaAs.

16. The method of claim 12, wherein aspect ratio trapping includes depositing one or more buffer layer configured to overcome a lattice mismatch between the first material and the dielectric layer.

17. The method of claim 12, wherein the at least one sidewall of each of the plurality of FIN structures forms a retrograde angle with respect to the base of the respective one of the plurality of FIN structures, the retrograde angle ranging from about 45° to about 90°.

18. The method of claim 12, wherein a ratio of the lateral dimension of the opening of each of the plurality of FIN structures to the lateral dimension of the base of the respective one of the plurality of FIN structures ranging from about 2 to about 5.

19. The method of claim 12, further comprising:
(f) measuring a dislocation density of the material within each FIN structure of the first portion of the plurality;
(g) comparing the measured dislocation density to a pre-determined dislocation density; and
(h) either (1) further processing the substrate when the measured dislocation density is less than the pre-determined dislocation density or (2) replacing the substrate with a new substrate and repeating (a)-(e) on the new substrate while changing an aspect ratio of the plurality of FIN structures, a retrograde angle of the plurality of FIN structures, changing the first material, or adding one or more buffer layers during aspect ratio trapping.

20. The method of claim 19, wherein the pre-determined dislocation density ranges from about $e^{10}$ °dislocations per cubic centimeter to about $e^{22}$ dislocations per cubic centimeter.

* * * * *

UNITED STATES PATENT AND TRADEMARK OFFICE
CERTIFICATE OF CORRECTION

PATENT NO. : 8,481,341 B2
APPLICATION NO. : 13/487878
DATED : July 9, 2013
INVENTOR(S) : Robert D. Clark Page 1 of 1

It is certified that error appears in the above-identified patent and that said Letters Patent is hereby corrected as shown below:

In the Specification

In Col. 3, line 60, "wherein a may" should read --wherein α may--.

In the Claims

In Col. 8, line 57, "about $e^{10°}$ dislocations" should read --about $e^{10}$ dislocations--.

Signed and Sealed this
Twenty-seventh Day of August, 2013

Teresa Stanek Rea
*Acting Director of the United States Patent and Trademark Office*